(12) United States Patent
Tung et al.

(10) Patent No.: US 11,901,870 B2
(45) Date of Patent: Feb. 13, 2024

(54) AMPLIFIER

(71) Applicant: Realtek Semiconductor Corporation, Hsinchu (TW)

(72) Inventors: Ming-Hui Tung, Hsinchu (TW); Shawn Min, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 116 days.

(21) Appl. No.: 17/536,227

(22) Filed: Nov. 29, 2021

(65) Prior Publication Data

US 2022/0286102 A1 Sep. 8, 2022

(30) Foreign Application Priority Data

Mar. 4, 2021 (TW) ................................. 110107778

(51) Int. Cl.
*H03G 3/30* (2006.01)
*H03F 3/04* (2006.01)
(52) U.S. Cl.
CPC .................. *H03G 3/30* (2013.01); *H03F 3/04* (2013.01); *H03G 2201/103* (2013.01)
(58) Field of Classification Search
CPC .... H03G 3/30; H03G 2201/103; H03G 11/04; H03F 3/04; H03F 2203/45022; H03F 2203/45504; H03F 3/45201
USPC .................................. 330/136, 254, 278, 279
See application file for complete search history.

(56) References Cited

U.S. PATENT DOCUMENTS

| 7,733,175 | B2* | 6/2010 | Lu ......................... F41B 11/642 330/136 |
| 11,271,536 | B2* | 3/2022 | Benboudjema ...... H03G 3/3036 |
| 2003/0102911 | A1* | 6/2003 | Raghavan ............. H03F 1/3223 330/136 |
| 2008/0191803 | A1 | 8/2008 | Lien et al. |
| 2009/0072904 | A1 | 3/2009 | Bae et al. |
| 2016/0204753 | A1* | 7/2016 | Uemura ............... H03G 3/3084 330/278 |

FOREIGN PATENT DOCUMENTS

CN 106656086 A 5/2017

OTHER PUBLICATIONS

S. Gondi et al., "Equalization and Clock and Data Recovery Techniques for 10-Gb/s CMOS Serial-Link Receivers," IEEE Journal of Solid-State Circuits, vol. 42, No. 9, pp. 1999-2011, Sep. 2007.

* cited by examiner

*Primary Examiner* — Khanh V Nguyen
(74) *Attorney, Agent, or Firm* — Locke Lord LLP; Tim Tingkang Xia, Esq.

(57) ABSTRACT

An amplifier includes an amplifier circuit and a gain adjusting circuit. The amplifier circuit has a design gain and a real gain and is configured to output an output signal according to an input signal and the real gain. The gain adjusting circuit is coupled to the amplifier circuit and is configured to receive the input signal to compare a voltage of the input signal with a first reference voltage, wherein when the voltage of the input signal exceeds the first reference voltage, the gain adjusting circuit increases the real gain of the amplifier circuit, so that the real gain approach the design gain.

20 Claims, 7 Drawing Sheets

AMPLIFIER

CROSS-REFERENCE TO RELATED APPLICATION

This application claims priority to Taiwan Application Serial Number 110107778, filed Mar. 4, 2021, which is herein incorporated by reference in its entirety.

BACKGROUND

Field of Invention

This disclosure relates to an amplifier, and in particular to an amplifier having a gain adjusting circuit.

Description of Related Art

Generally, in an assumption that an amplifier circuit has a gain of 0 dB, when an input signal inputted to the amplifier circuit is a small signal (e.g., 70 mV), the amplitude of an output signal of the amplifier circuit is substantially equal to those of the input signal. However, when the input signal is a large signal (e.g., 1000 mV), the gain of the amplifier circuit is difficult to maintain at 0 dB due to the characteristic of the transistors in the amplifier circuit. In brief, when receiving a large input signal, the conventional amplifier circuit often faces the problem of nonlinear amplification, so that a back-end circuit receives a distorted signal. Therefore, it is necessary to improve the conventional amplifier circuit.

SUMMARY

An aspect of present disclosure relates to an amplifier. The amplifier includes an amplifier circuit and a gain adjusting circuit. The amplifier circuit has a design gain and a real gain and is configured to output an output signal according to an input signal and the real gain. The gain adjusting circuit is coupled to the amplifier circuit and is configured to receive the input signal to compare a voltage of the input signal with a first reference voltage, wherein when the voltage of the input signal exceeds the first reference voltage, the gain adjusting circuit increases the real gain of the amplifier circuit, so that the real gain approach the design gain.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
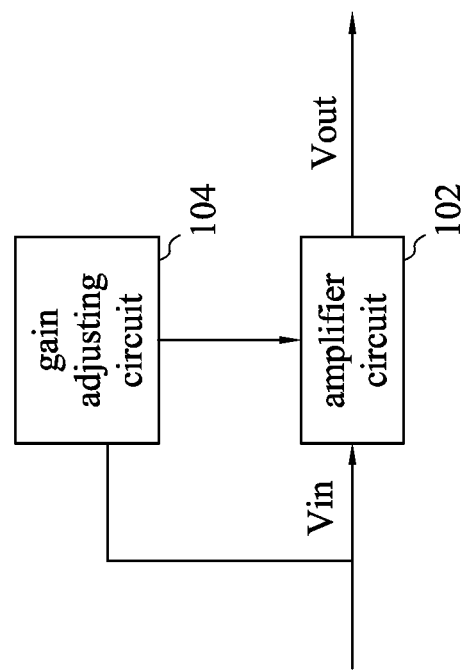
FIG. 1 is a block diagram of an amplifier in accordance with some embodiments of the present disclosure.

Referring to FIG. 1, FIG. 1 depicts an amplifier 100 in accordance with an embodiment of the present disclosure. The amplifier 100 includes an amplifier circuit 102 and a gain adjusting circuit 104.

Figure 2:
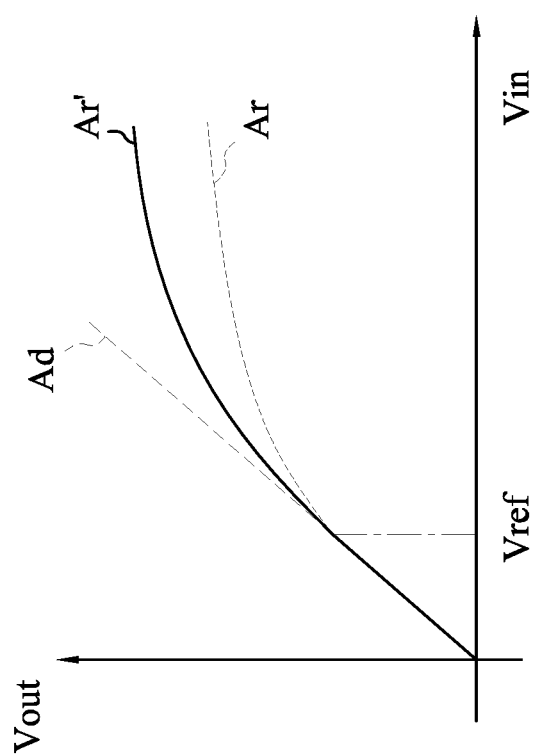
FIG. 2 is a schematic diagram of a design gain, a pre-adjusted real gain and a post-adjusted real gain of an amplifier circuit of an amplifier in accordance with some embodiments of the present disclosure.

In the present embodiment, the amplifier circuit 102 is designed to have a design gain Ad. Referring to FIG. 2 together, in an ideal condition, the amplifier circuit 102 is configured to output an output signal Vout according to an input signal Vin and the design gain Ad. The relationship between the input signal Vin and the output signal Vout is linear. For example, no matter what the amplitude of the input signal Vin is, the design gain Ad would be obtained by dividing the amplitude of the output signal Vout by the amplitude of the input signal Vin.

In the practical application, the amplifier circuit 102 is configured to output the output signal Vout according to the input signal Vin and a real gain Ar. However, when the amplitude of the input signal Vin exceeds a first reference voltage Vref, the relationship between the input signal Vin and the output signal Vout is not able to be linear due to the characteristic of transistor. For example, when the amplitude of the input signal Vin (e.g., 70 mV) does not exceed the first reference voltage Vref (e.g., 500 mV), the real gain Ar would substantially equal the design gain Ad. By contrast, when the amplitude of the input signal Vin (e.g., 1000 mV) exceeds the first reference voltage Vref, the real gain Ar would be smaller than the design gain Ad, and the difference between the real gain Ar and the design gain Ad would increase following the increased amplitude of the input signal Vin.

Figure 3:
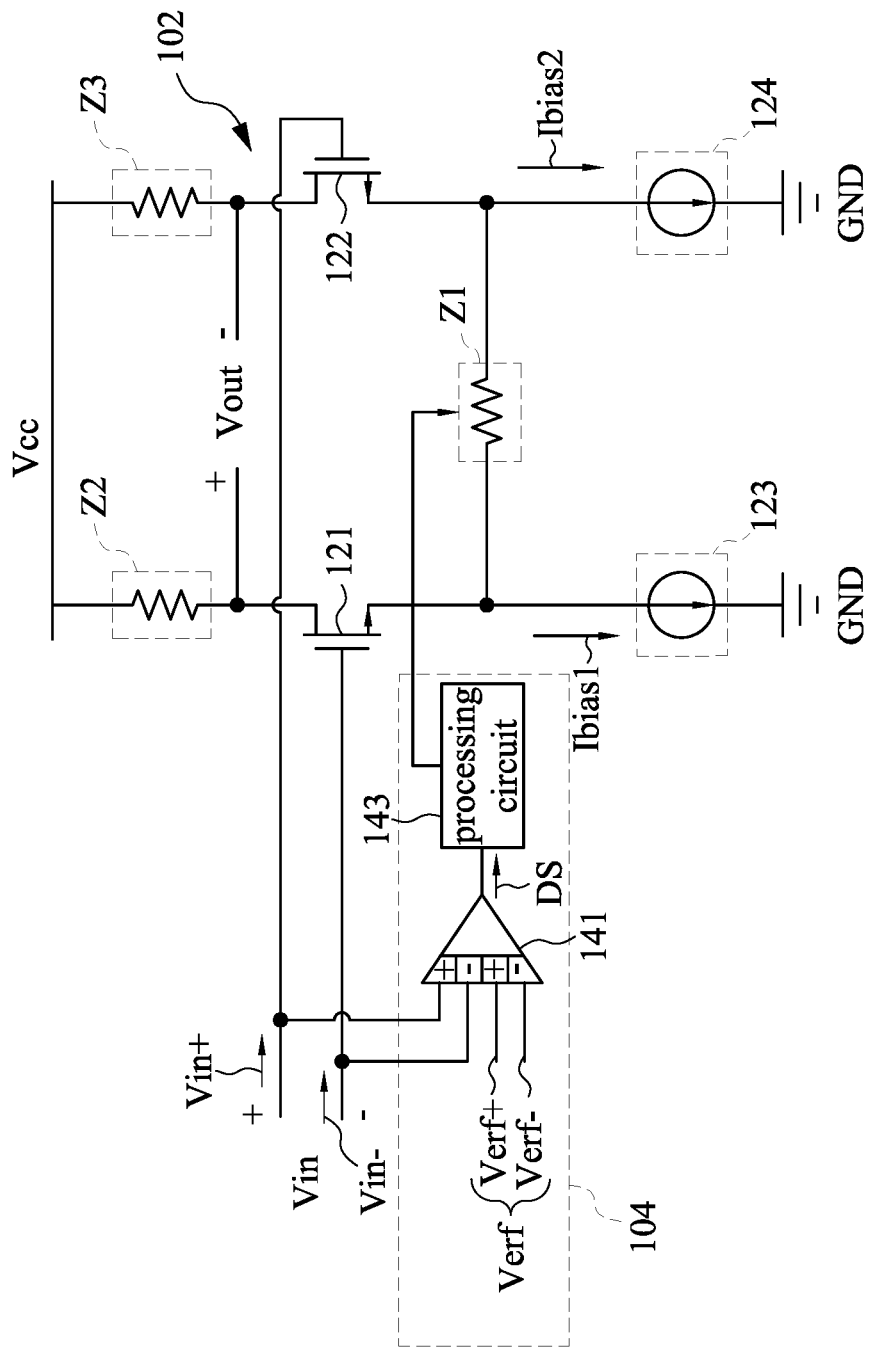
FIG. 3 is a circuit diagram of an amplifier in accordance with some embodiments of the present disclosure.

Specifically, the amplifier circuit 102 is a differential amplifier, and the input signal Vin is a differential signal. Referring to FIG. 3, the amplifier circuit 102 includes a first amplifying transistor 121, a second amplifying transistor 122, a first current source 123, a second current source 124, a first impedance element Z1, a second impedance element Z2 and a third impedance element Z3. The input signal Vin has a positive input signal Vin+ and a negative input signal Vin−.

A control terminal (e.g., gate terminal) of the first amplifying transistor 121 is coupled to a negative input terminal of the amplifier circuit 102 and is configured to receive the negative input signal Vin−. A control terminal (e.g., gate terminal) of the second amplifying transistor 122 is coupled to a positive input terminal of the amplifier circuit 102 and is configured to receive the positive input signal Vin+. A first terminal (e.g., drain terminal) of the first amplifying transistor 121 is coupled to a positive output terminal of the amplifier circuit 102, and a first terminal (e.g., drain terminal) of the second amplifying transistor 122 is coupled to a negative output terminal of the amplifier circuit 102. Two terminals of the first impedance element Z1 are coupled to a second terminal (e.g., source terminal) of the first amplifying transistor 121 and a second terminal (e.g., source terminal) of the second amplifying transistor 122 respectively. Two terminals of the second impedance element Z2 are coupled to the first terminal of the first amplifying transistor 121 and a system high voltage Vcc respectively. Two terminals of the third impedance element Z3 are coupled to the first terminal of the second amplifying transistor 122 and the system high voltage Vcc respectively. The first current source 123 is coupled to the second terminal of the first amplifying transistor 121 and a ground voltage GND and is configured to provide a first bias current Ibias1. The second current source 124 is coupled to the second terminal of the second amplifying transistor 122 and the ground voltage GND and is configured to provide a second bias current Ibias2.

As shown in FIG. 1 again, the gain adjusting circuit 104 is coupled to the amplifier circuit 102. In the present embodiment, the gain adjusting circuit 104 includes a comparator 141 and a processing circuit 143. The comparator 141 is coupled to the positive and negative input terminals of the amplifier circuit 102. The processing circuit 143 is coupled to an output terminal of the comparator 141, and an output terminal of the processing circuit 143 is coupled to the first impedance element Z1 of the amplifier circuit 102.

During the operation, the comparator 141 is configured to receive the input signal Vin inputted to the amplifier circuit 102 and the first reference voltage Vref and compare the voltage of the input signal Vin with the first reference voltage Vref. Specifically, the first reference voltage Vref includes a positive first reference voltage Vref+ and a negative first reference voltage Vref−. The comparator 141 is configured to compare the voltage of the positive input signal Vin+ with the positive first reference voltage Vref+ and compare the voltage of the negative input signal Vin− with the negative first reference voltage Vref−. When detecting that the voltage of the positive input signal Vin+ (e.g., 600 mV) is greater than the positive first reference voltage Vref+ (e.g., 500 mV) and that the voltage of the negative input signal Vin− (e.g., −600 mV) is smaller than the negative first reference voltage Vref− (e.g., −500 mV), the comparator 141 outputs a detection signal DS to the processing circuit 143.

In the present embodiment, the processing circuit 143 is configured to decrease the resistance according to the detection signal DS. Based on the small signal model, the gain of the amplifier circuit 102 satisfies the following formula (1):

$$Ar = gm \times Rd / (1 + gm \times Rs/2) \quad (1)$$

Where Ar is the real gain of the amplifier circuit 102, gm is the transconductance of the first amplifying transistor 121 or the second amplifying transistor 122, Rd is the resistance of the second impedance element Z2 or the third impedance element Z3, and the Rs is the resistance of the first impedance element Z1.

Accordingly, when the processing circuit 143 decreases the resistance of the first impedance element Z1, the real gain Ar of the amplifier circuit 102 would increase to approach the design gain Ad. In other words, when the comparator 141 detects that the voltage of the input signal Vin exceeds the first reference voltage Vref (at this time, the real gain Ar is smaller than the design gain Ad due to the characteristic of transistor), the processing circuit would decrease the resistance of the first impedance element Z1 to increase the real gain Ar of the amplifier circuit 102, so that the real gain Ar approaches the design gain Ad.

In another embodiment, the comparator 141 is further configured to receive a second reference voltage (not shown) greater than the first reference voltage Vref besides the input signal Ving and the first reference voltage Vref. After the processing circuit 143 increases the real gain Ar of the amplifier circuit 102, if the voltage of the input signal Vin is increased again to exceed the second reference voltage, the comparator 141 would output the detection signal DS again to the processing circuit 143. Therefore, the processing circuit 143 decreases the resistance of the first impedance element Z1 to increase the real gain Ar of the amplifier circuit 102 again. It can be appreciated that the comparator 141 can receive more reference voltages (e.g., a third reference voltage (not shown) greater than the second reference voltage) according to the requirement, so that the processing circuit 143 can continuously increase the real gain Ar of the amplifier circuit 102 following the increase of the input signal Vin. In such way, the post-adjusted real gain Ar' (as shown in FIG. 2) would has the linearity higher than the pre-adjusted real gain Ar.

Figure 4:
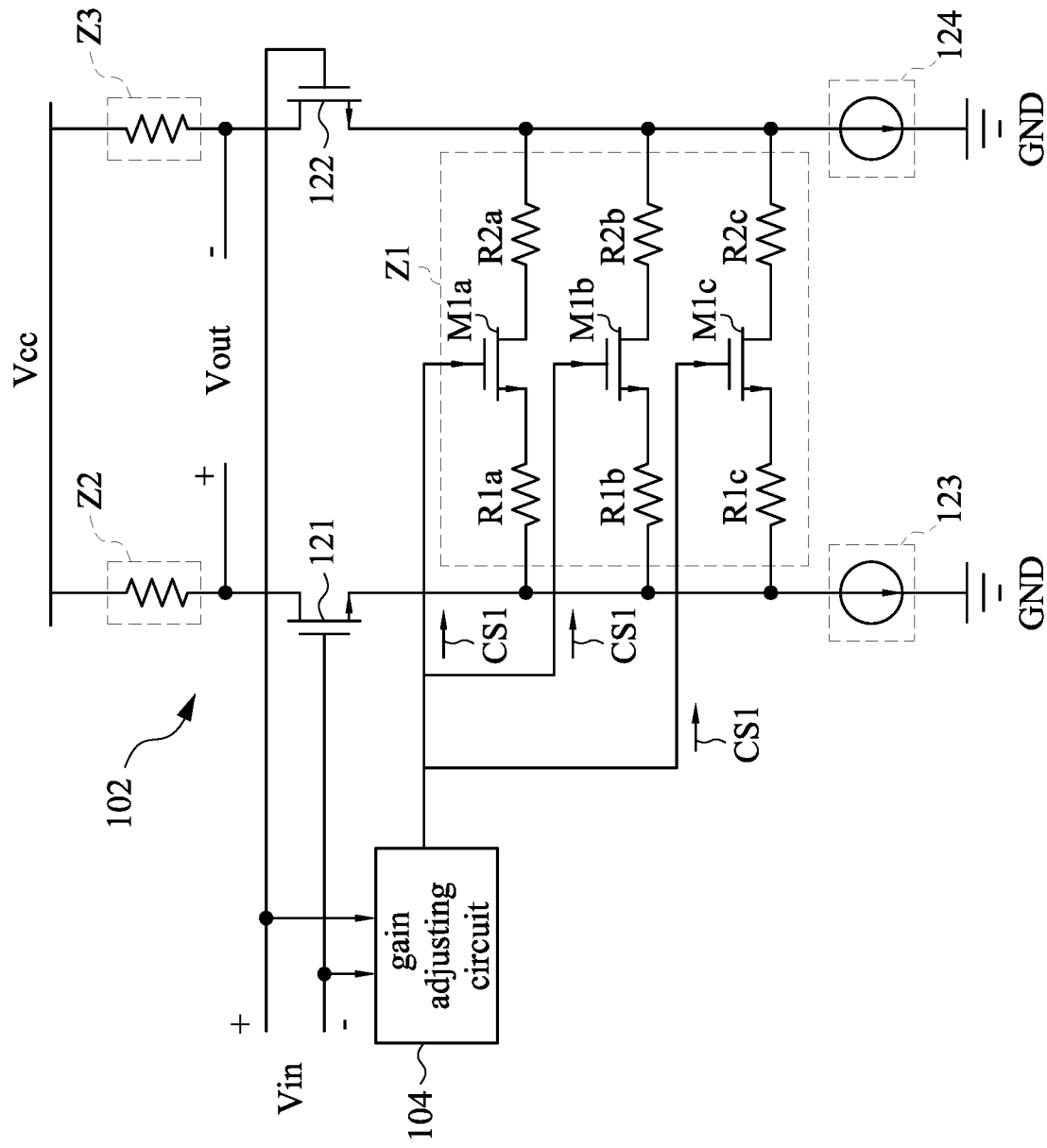
FIG. 4 is a circuit diagram of an amplifier in accordance with some embodiments of the present disclosure.

Referring to FIGS. 3 and 4 together, the first impedance element Z1 of the amplifier circuit 102 includes a plurality of first transistors M1a-M1c, a plurality of first resistors R1a-R1c and a plurality of second resistors R2a-R2c. The first terminals (e.g., drain terminal) of the first transistors M1a-M1c are coupled to the second terminal of the second amplifying transistor 122 and the second current source 124 by the second resistors R2a-R2c, respectively. The second terminals (e.g., source terminal) of the first transistors M1a-M1c are coupled to the second terminal of the first amplifying transistor 121 and the first current source 123 by the first resistors R1a-R1c, respectively. The processing circuit 143 of the gain adjusting circuit 104 is coupled to the control terminals (e.g., gate terminal) of the first transistors M1a-M1c.

In an assumption that only the first transistor M1a is conducted before the processing circuit 143 receives the detection signal DS. At this time, the first transistors M1b-M1c are blocked, and the equivalent resistance of the first impedance element Z1 substantially equals a sum of the resistance of the first resistor Ria and the resistance of the second resistor R2a. When receiving the detection signal DS, the processing circuit 143 can outputs a plurality of first control signal CS1 to the control terminals of the first transistors M1a-M1c, so that the first transistor M1a is still conducted and the first transistors M1b-M1c are switched from being blocked to being conducted. In such way, the equivalent resistance of the first impedance element Z1 is decreased because three groups of resistors connected in series (i.e., the first resistor R1a and the second resistor R2a, the first resistor R1b and the second resistor R2b, the first resistor R1c and the second resistor R2c) are connected in parallel.

In another embodiment, the first impedance element Z1 can only include the first transistor M1a (that is, the first transistors M1b-M1c, the first resistors R1a-R1c and the second resistors R2a-R2c of FIG. 4 are omitted), in which the first terminal of the first transistor M1a is coupled to the second terminal of the second amplifying transistor 122 and the second current source 124, the second terminal of the first transistor Mia is coupled to the second terminal of the first amplifying transistor 121 and the first current source 123, and the processing circuit 143 is coupled to the control terminal of the first transistor M1a. It is worth noting that the first transistor M1a is biased to be at a linear region (or ohmic region). In such way, when receiving the detection signal DS, the processing circuit 143 can control the voltage level of the first control signal CS1 outputted to the control terminal of the first transistor M1a, so that the equivalent resistance of the first impedance element Z1 is decreased (because the first transistor M1a biased to be at the linear region performs like a voltage control resistor).

In another embodiment, when receiving the detection signal DS, the processing circuit 143 is configured to output a plurality of the third control signals (not shown) to adjust the resistance of the second impedance element Z2 and the resistance of the third impedance element Z3, so as to increase the real gain Ar of the amplifier circuit 102. Based on the aforementioned formula (1), when the resistance of the second impedance element Z2 and the resistance of the third impedance element Z3 are increased by the processing circuit 143, the real gain Ar of the amplifier circuit 102 would be increased to approach the design gain Ad. Specifically, the second impedance element Z2 and the third impedance element Z3 can be implemented by a variable resistor or can be implemented by the transistor like the first impedance element Z1, and the descriptions thereof are omitted herein.

Figure 5:
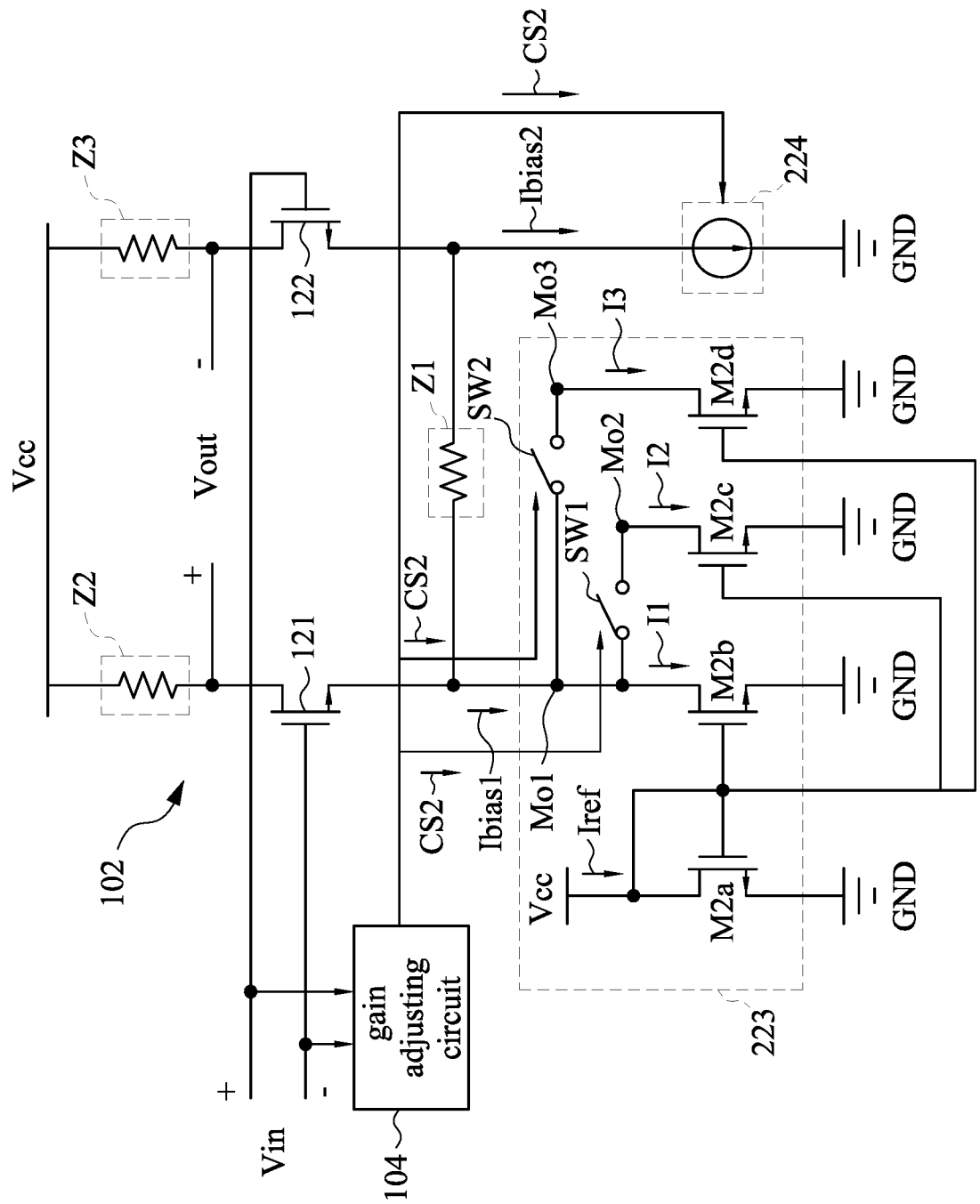
FIG. 5 is a circuit diagram of another amplifier in accordance with other embodiments of the present disclosure.

Referring to FIG. 5, FIG. 5 depicts a circuit diagram of an amplifier 200 in accordance with another embodiment of the present disclosure, in which some elements (e.g., the comparator 141 and the processing circuit 143 in the gain adjusting circuit 104, the first amplifying transistor 121, the second amplifying transistor 122), which are same or similar to those of the amplifier 100, in the amplifier 200 are not described herein. During the operation of the amplifier 200, the processing circuit 143 is configured to adjust a first bias current Ibias1 provided by a first current source 223 and a second bias current Ibias2 provided by a second current source 224 according to the detection signal DS, so as to increase the real gain Ar of the amplifier circuit 102. Specifically, the first current source 223 includes a first current mirror (including second transistors M2a and M2b), a second current mirror (including second transistors M2a and M2c) and a third current mirror (including second transistors M2a and M2d). An output terminal Mo1 of the first current mirror is directly coupled to the second terminal of the first amplifying transistor 121, and an output terminal Mo2 of the second current mirror and an output terminal Mo3 of the third current mirror are coupled to the second terminal of the first amplifying transistor 121 by first switch elements SW1 and SW2, respectively.

In an assumption that only the first current mirror provides a first current I1 according to a first reference current Iref before the processing circuit 143 receives the detection signal DS. At this time, the first bias current Ibias 1 provided by the first current source 223 is the first current I1. When receiving the detection signal DS, the processing circuit 143 of the gain adjusting circuit 104 is configured to output a plurality of the second control signals CS2 to adjust the first switch elements SW1 and SW2 to conduct the output terminal Mo2 of the second current mirror and the second terminal of the first amplifying transistor 121 and to conduct the output terminal Mo3 of the third current mirror and the second terminal of the first amplifying transistor 121. In such way, the first current I1, a second current I2 (provided by the second current mirror according to the first reference current Iref) and a third current I3 (provided by the third current mirror according to the first reference current Iref) are provided simultaneously, so that the first bias current Ibias1 provided by the first current source 223 is increased. It can be appreciated that the second current source 224 can be implemented by a plurality of current mirrors (not shown) like the first current source 223, and the descriptions thereof are omitted herein.

Since the transconductance gm of the first amplifying transistor 121 (or the second amplifying transistor 122) is in direct proportion with a square root of the first bias current Ibias1 (the second bias current Ibias2), when the first bias current Ibias1 (the second bias current Ibias2) is increased by the processing circuit 143, the transconductance gm of the first amplifying transistor 121 (or the second amplifying transistor 122) would be increased. In such way, based on the aforementioned formula (1), when the transconductance gm of the first amplifying transistor 121 (or the second amplifying transistor 122) is increased, the real gain Ar of the amplifier circuit 102 would be increased to approach the design gain Ad.

Figure 6:
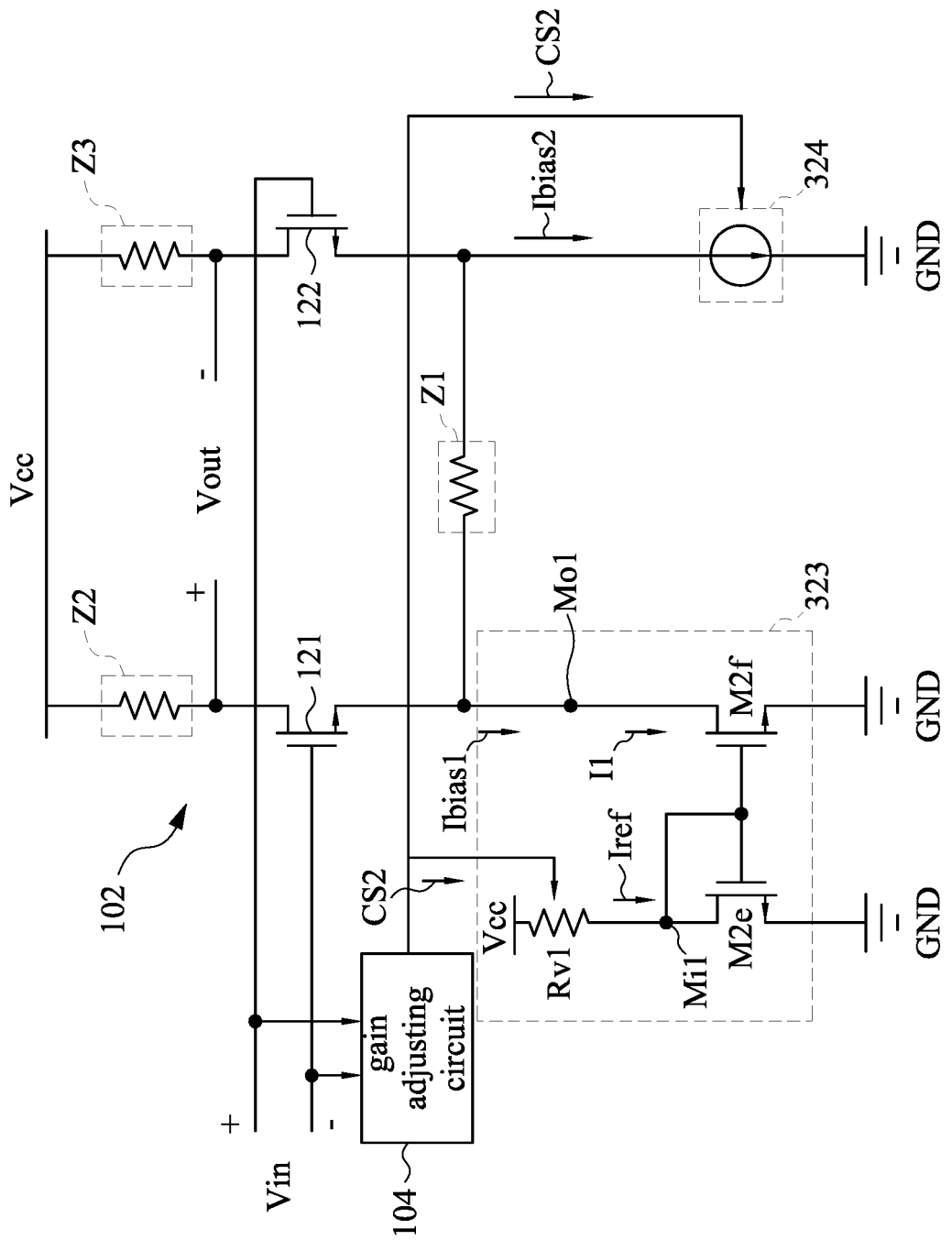
FIG. 6 is a circuit diagram of another amplifier in accordance with other embodiments of the present disclosure.

Referring to FIG. 6, FIG. 6 depicts a circuit diagram of an amplifier 300 in accordance with another embodiment of the present disclosure, in which some elements, which are same or similar to those of the amplifier 100, in the amplifier 300 are not described herein. During the operation of the amplifier 300, the processing circuit 143 is configured to adjust a first bias current Ibias1 provided by a first current source 323 and a second bias current Ibias2 provided by a second current source 324 according to the detection signal DS, so as to increase the real gain Ar of the amplifier circuit 102. Specifically, the first current source 323 includes a first current mirror (including second transistors M2e and M2f) and a first variable resistor Rv1. An output terminal Mo1 of the first current mirror is directly coupled to the second terminal of the first amplifying transistor 121, and the first variable resistor Rv1 is coupled to an input terminal Mi1 of the first current mirror and the system high voltage Vcc.

When receiving the detection signal DS, the processing circuit 143 can output the second control signal CS2 to the first variable resistor Rv1 to decrease the resistance of the first variable resistor Rv1, so that the first reference current Iref flowing into the input terminal Mi1 of the first current mirror would be increased. The first current mirror provides more first current I1 according to the increased first reference current Iref, so that the first bias current Ibias1 provided by the first current source 323 would increase. In such way, the real gain Ar of the amplifier circuit 102 would be increased to approach the design gain Ad. It can be appreciated that the second current source 324 can be implemented by a second current mirrors (not shown) and a second variable resistor (not shown) like the first current source 323, and the descriptions thereof are omitted herein.

Figure 7:
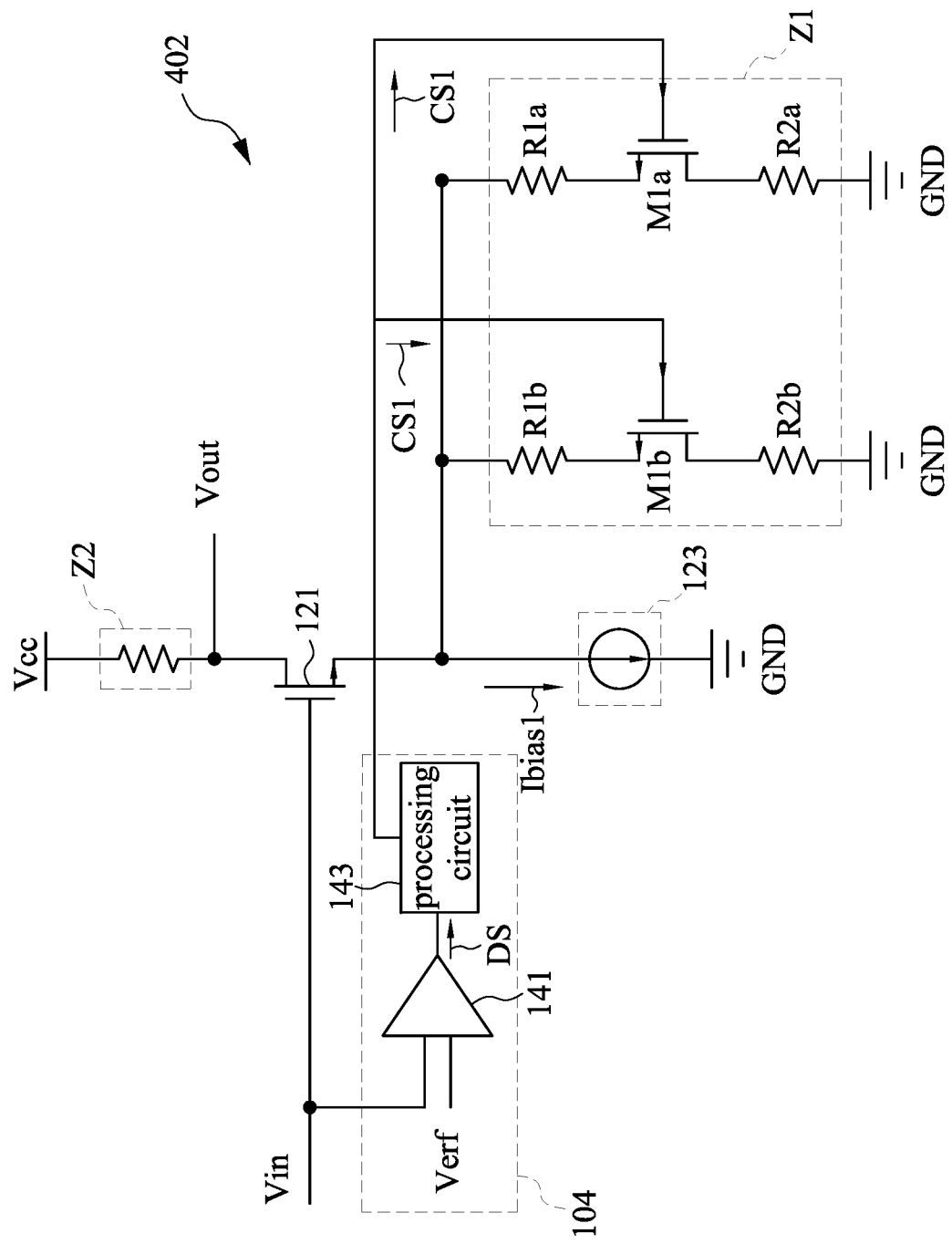
FIG. 7 is a circuit diagram of another amplifier in accordance with other embodiments of the present disclosure.

Referring to FIG. 7, FIG. 7 depicts a circuit diagram of an amplifier 400 in accordance with another embodiment of the present disclosure, in which some elements, which are same or similar to those of the aforementioned embodiments, in the amplifier 400 are not described herein. An amplifier circuit 402 of the amplifier 400 is a single end amplifier. The first impedance element Z1 is coupled to the second terminal of the first amplifying transistor 121 and the ground voltage GND. During the operation of the amplifier 400, when receiving the detection signal DS, the processing circuit 143 is configured to output the first control signal CS1 to adjust the resistance of the first impedance element Z1, so as to increase the real gain Ar of the amplifier circuit 102 to approach the design gain Ad. It can be appreciated that the processing circuit 143 of the amplifier 400 can be configured to output the second control signal (not shown) to adjust the first bias current Ibias1 provided by the first current source 123 or be configured to output the third control signal (not shown) to adjust the resistance of the second impedance element Z2.

In the present embodiment, the first amplifying transistor 121, the second amplifying transistor 122, the first transistors M1a-M1c and the second transistors M2a-M2f are N-type MOS (metal oxide semiconductor), however, the present disclosure is not limited herein. In other embodiments, the first amplifying transistor 121, the second amplifying transistor 122, the first transistors M1a-M1c and the second transistors M2a-M2f can be implemented by P-type MOS or BJT (bipolar junction transistor).

In sum, by the design of the gain adjusting circuit 104, the amplifiers 100-400 of the present disclosure are able to adjust the real gain Ar of the amplifier circuits 102 and 402 if the input signal Vin exceeds the first reference voltage Vref, so that the real gain Ar approaches the design gain Ad which is originally designed for the amplifier circuits 102 and 402. In such way, when receiving the input signal Vin with different amplitude, the amplifiers 100-400 can still be maintained to have same gain (that is, the amplifiers 100-400 can keep the linearity of amplification, even if being affected by the characteristic of transistor), so that the back-end circuit receives a signal without distortion.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An amplifier, comprising:
an amplifier circuit having a design gain and a real gain and configured to output an output signal according to an input signal and the real gain; and
a gain adjusting circuit coupled to the amplifier circuit and configured to receive the input signal to compare a voltage of the input signal with a first reference voltage;
wherein when the voltage of the input signal exceeds the first reference voltage, the gain adjusting circuit increases the real gain of the amplifier circuit, so that the real gain approach the design gain.

2. The amplifier of claim 1, wherein the amplifier circuit comprises an amplifying transistor and a first impedance element, a control terminal of the amplifying transistor is configured to receive the input signal, a first terminal of the amplifying transistor is coupled to an output terminal of the amplifier circuit, and a second terminal of the amplifying transistor is coupled to the first impedance element.

3. The amplifier of claim 2, wherein the first impedance element comprises a first transistor, a first terminal or a second terminal of the first transistor is coupled to the second terminal of the amplifying transistor, and the gain adjusting circuit is coupled to a control terminal of the first transistor and is configured to output a first control signal to the control terminal of the first transistor to decrease the resistance of the first impedance element so as to increase the real gain of the amplifier circuit.

4. The amplifier of claim 3, wherein the first impedance element further comprises a first resistor, and the first resistor is coupled to the first terminal or the second terminal of the first transistor.

5. The amplifier of claim 2, wherein the amplifier circuit further comprises a current source, and the current source is coupled to the second terminal of the amplifying transistor and is configured to provide a bias current.

6. The amplifier of claim 5, wherein the current source comprises a first current mirror, an output terminal of the first current mirror is coupled to the second terminal of the amplifying transistor, and the first current mirror is configured to provide a first current according to a reference current so that the current source provides the bias current.

7. The amplifier of claim 6, wherein the current source further comprises a second current mirror, an output terminal of the second current mirror is coupled to the second terminal of the amplifying transistor through a switch element, the second current mirror is configured to provide a second current according to the reference current, the gain adjusting circuit is coupled to the switch element and is configured to conduct the output terminal of the second current mirror and the second terminal of the amplifying transistor by outputting a second control signal to the switch element, and the first current and the second current are provided simultaneously to increase the bias current provided by the current source so as to increase the real gain of the amplifier circuit.

8. The amplifier of claim 6, wherein the current source further comprises a variable resistor, the variable resistor is coupled to an input terminal of the first current mirror, the gain adjusting circuit is coupled to the variable resistor and is configured to decrease the resistance of the variable resistor by outputting a second control signal, and the first current provided by the first current mirror is increased to increase the bias current provided by the current source so as to increase the real gain of the amplifier circuit.

9. The amplifier of claim 5, wherein the amplifier circuit further comprises a second impedance element, the second impedance element is coupled to the first terminal of the amplifying transistor, and the gain adjusting circuit is configured to output a third control signal to the second impedance element, to increase the resistance of the second impedance element, so as to increase the real gain of the amplifier circuit.

10. The amplifier of claim 1, wherein the gain adjusting circuit comprises a comparator and a processing circuit, the comparator is configured to receive the input signal and the first reference voltage, and when the voltage of the input signal exceeds the first reference voltage, the comparator is configured to output a detection signal to the processing circuit, and the processing circuit is configured to increase the real gain of the amplifier circuit according to the detection signal.

11. The amplifier of claim 1, wherein the gain adjusting circuit is further configured to compare the voltage of the input signal with a second reference voltage greater than the first reference voltage, and when the voltage of the input signal exceeds the second reference voltage, the gain adjusting circuit increases the real gain of the amplifier circuit again.

12. The amplifier of claim 1, wherein the amplifier circuit comprises a first amplifying transistor, a second amplifying transistor and a first impedance element, the input signal has a positive input signal and a negative input signal, a control terminal of the first amplifying transistor is configured to receive the negative input signal, a first terminal of the first amplifying transistor is coupled to a positive output terminal of the amplifier circuit, a control terminal of the second amplifying transistor is configured to receive the positive input signal, a first terminal of the second amplifying transistor is coupled to a negative output terminal of the amplifier circuit, and the first impedance element is coupled to a second terminal of the first amplifying transistor and a second terminal of the second amplifying transistor.

13. The amplifier of claim 12, wherein the first impedance element comprises a first transistor, a first terminal and a second terminal of the first transistor are coupled to the second terminal of the first amplifying transistor and the second terminal of the second amplifying transistor, and the gain adjusting circuit is coupled to a control terminal of the first transistor and is configured to output a first control signal to the control terminal of the first transistor to decrease the resistance of the first impedance element so as to increase the real gain of the amplifier circuit.

14. The amplifier of claim 13, wherein the first impedance element further comprises a first resistor and a second resistor, and the first resistor and second resistor are coupled to the first terminal and the second terminal of the first transistor respectively.

15. The amplifier of claim 12, wherein the amplifier circuit further comprises a first current source and a second current source, the first current source is coupled to the second terminal of the first amplifying transistor and is configured to provide a first bias current, and the second current source is coupled to the second terminal of the second amplifying transistor and is configured to provide a second bias current.

16. The amplifier of claim 15, wherein the first current source comprises a first current mirror, an output terminal of the first current mirror is coupled to the second terminal of the first amplifying transistor, and the first current mirror is configured to provide a first current according to a first reference current so that the first current source provides the first bias current;
the second current source comprises a second current mirror, an output terminal of the second current mirror is coupled to the second terminal of the second amplifying transistor, and the second current mirror is configured to provide a second current according to a second reference current so that the second current source provides the second bias current.

17. The amplifier of claim 16, wherein the first current source further comprises a third current mirror, an output terminal of the third current mirror is coupled to the second terminal of the first amplifying transistor through a first switch element, the third current mirror is configured to provide a third current according to the first reference current, the second current source further comprises a fourth current mirror, an output terminal of the fourth current mirror is coupled to the second terminal of the second amplifying transistor through a second switch element, the fourth current mirror is configured to provide a fourth current according to the second reference current;
the gain adjusting circuit is coupled to the first switch element and the second switch element and is configured to conduct the output terminal of the third current mirror and the second terminal of the first amplifying transistor and conduct the output terminal of the fourth current mirror and the second terminal of the second amplifying transistor by outputting a plurality of second control signals to the first switch element and the second switch element, and the first current, the second current, the third current and the fourth current are provided simultaneously to increase the first bias current provided by the first current source and the second bias current provided by the second current source so as to increase the real gain of the amplifier circuit.

18. The amplifier of claim 16, wherein the first current source further comprises a first variable resistor, the first variable resistor is coupled to an input terminal of the first current mirror, the second current source further comprises a second variable resistor, the second variable resistor is coupled to an input terminal of the second current mirror;
the gain adjusting circuit is coupled to the first variable resistor and the second variable resistor and is configured to decrease the resistance of the first variable resistor and the resistance of the second variable resistor by outputting a plurality of second control signals to the first variable resistor and the second variable resistor, and the first current provided by the first current mirror and the second current provided by the second current mirror are increased to increase the first bias current provided by the first current source and the second bias current provided by the second current source so as to increase the real gain of the amplifier circuit.

19. The amplifier of claim 15, wherein the amplifier circuit further comprises a second impedance element and a third impedance element, the second impedance element is coupled to the first terminal of the first amplifying transistor, the third impedance element is coupled to the first terminal of the second amplifying transistor, and the gain adjusting circuit is configured to output a plurality of third control signals to the second impedance element and the third impedance element, to increase the resistance of the second impedance element and the resistance of the third impedance element, so as to increase the real gain of the amplifier circuit.

20. The amplifier of claim 12, wherein the first reference voltage comprises a positive first reference voltage and a negative first reference voltage, the gain adjusting circuit is configured to compare a voltage of the positive input signal with the positive first reference voltage and is configured to compare a voltage of the negative input signal with the negative first reference voltage, and when the voltage of the positive input signal is greater than the positive first reference voltage and the voltage of the negative input signal is smaller than the negative first reference voltage, the gain adjusting circuit increase the real gain of the amplifier circuit.

* * * * *